(12) United States Patent
Jang et al.

(10) Patent No.: US 11,367,647 B2
(45) Date of Patent: Jun. 21, 2022

(54) METHOD OF MANUFACTURING ELECTRONIC DEVICE

(71) Applicant: Daegu Gyeongbuk Institute of Science and Technology, Daegu (KR)

(72) Inventors: Kyung In Jang, Incheon (KR); Ho Hyun Keum, Seoul (KR); Jong Cheol Rah, Daegu (KR); Seung Kyoung Heo, Hwaseong-si (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 342 days.

(21) Appl. No.: 16/675,559

(22) Filed: Nov. 6, 2019

(65) Prior Publication Data

US 2021/0090932 A1   Mar. 25, 2021

(30) Foreign Application Priority Data

Sep. 20, 2019   (KR) .................. 10-2019-0116259

(51) Int. Cl.
| | |
|---|---|
| *B32B 43/00* | (2006.01) |
| *H01L 21/683* | (2006.01) |
| *C09J 7/38* | (2018.01) |
| *B32B 37/00* | (2006.01) |
| *C09J 5/00* | (2006.01) |
| *B32B 38/10* | (2006.01) |

(52) U.S. Cl.
CPC ........ *H01L 21/6835* (2013.01); *B32B 37/025* (2013.01); *C09J 5/00* (2013.01); *C09J 7/38* (2018.01); *B32B 38/10* (2013.01); *B32B 43/006* (2013.01); *B32B 2457/00* (2013.01); *C09J 2203/326* (2013.01); *C09J 2301/502* (2020.08); *H01L 2221/68363* (2013.01); *H01L 2221/68386* (2013.01)

(58) Field of Classification Search
CPC . B32B 38/10; B32B 43/006; Y10T 156/1153; Y10T 156/1911
See application file for complete search history.

(56) References Cited

U.S. PATENT DOCUMENTS

| | | | |
|---|---|---|---|
| 6,020,252 | A | 2/2000 | Aspar et al. |
| 6,225,192 | B1 | 5/2001 | Aspar et al. |
| 6,809,009 | B2 | 10/2004 | Aspar et al. |

(Continued)

FOREIGN PATENT DOCUMENTS

| | | |
|---|---|---|
| EP | 0 858 110 A1 | 8/1998 |
| EP | 1 575 085 A2 | 9/2005 |

(Continued)

OTHER PUBLICATIONS

JP 2008/177182 translation of specification (Year: 2008).*

(Continued)

*Primary Examiner* — Philip C Tucker
*Assistant Examiner* — Nickolas R Harm
(74) *Attorney, Agent, or Firm* — Lex IP Meister, PLLC (57) ABSTRACT

A method of manufacturing an electronic device is provided. The method includes forming a stack structure by placing a to-be-peeled layer on a substrate, applying thermal shock to the stack structure, detaching the to-be-peeled layer from the substrate, and transferring the detached to-be-peeled layer to a target substrate.

5 Claims, 13 Drawing Sheets

(56) References Cited

U.S. PATENT DOCUMENTS

| | | |
|---|---|---|
| 7,067,396 B2 | 6/2006 | Aspar et al. |
| 7,498,234 B2 | 3/2009 | Aspar et al. |
| 8,101,503 B2 | 1/2012 | Aspar et al. |
| 10,186,629 B2 | 1/2019 | Forrest et al. |
| 11,056,339 B1 | 7/2021 | Jung et al. |
| 2001/0007789 A1 | 7/2001 | Aspar |
| 2004/0077166 A1 | 4/2004 | Nagal et al. |
| 2004/0166651 A1 | 8/2004 | Aspar et al. |
| 2006/0115961 A1 | 6/2006 | Aspar |
| 2009/0057791 A1 | 3/2009 | Akiyama et al. |
| 2009/0130392 A1 | 5/2009 | Aspar et al. |
| 2010/0289115 A1 | 11/2010 | Akiyama et al. |
| 2012/0075221 A1 | 3/2012 | Yasuda |
| 2012/0133028 A1 | 5/2012 | Aspar et al. |
| 2012/0228730 A1 | 9/2012 | Akiyama et al. |
| 2016/0197227 A1 | 7/2016 | Forrest et al. |
| 2021/0193452 A1 | 6/2021 | Jung et al. |

FOREIGN PATENT DOCUMENTS

| | | |
|---|---|---|
| JP | 11031828 | 2/1999 |
| JP | 2000-294904 | 10/2000 |
| JP | 2001-291728 | 10/2001 |
| JP | 2002-171009 | 6/2002 |
| JP | 2002-241191 | 8/2002 |
| JP | 2004-048038 | 2/2004 |
| JP | 2007-220782 | 8/2007 |
| JP | 2007-250576 | 9/2007 |
| JP | 2008-177182 | 7/2008 |
| JP | 2012-069042 | 4/2012 |
| JP | 2014-120664 | 6/2014 |
| KR | 10-2013-0126062 | 11/2013 |
| KR | 10-2016-0048142 | 5/2016 |
| KR | 10-2019-0066224 | 6/2019 |
| WO | 2006/011665 A1 | 2/2006 |
| WO | 2007-094230 | 8/2007 |

OTHER PUBLICATIONS

JP 2012/069042 translation of specification (Year: 2012).*
JPO, Office Action of JP 2019-202822 dated Dec. 14, 2020.
KIPO, Office Action of KR 10-2019-0116259 dated Dec. 25, 2020.
EU Search Report for 19207642.0, dated Jun. 5, 2020, 9 pp.
Direct Transfer Printing with Metal Oxide Layers for Fabricating Flexible Nanowire Devices by Sang Hoon Lee, Tai II Lee, Moon-Ho Ham, Su Jeong Lee, Ji Hyeon Park, Yun Cheol Kim, Pranab Biswas and Jae Min Myoung, www.MaterialsViews.com, Advanced Functional Materials 2015, 25, pp. 6921-6926 (6 pp), www.afm-journal.de, wileyonlinelibrary.com.
KIPO, Notice of Allowance of KR 10-2019-0116259 dated Jun. 22, 2021.

* cited by examiner

METHOD OF MANUFACTURING ELECTRONIC DEVICE

CROSS-REFERENCE TO RELATED APPLICATION

This application claims priority to Korean Patent Application No. 10-2019-0116259, filed on Sep. 20, 2019 in the Korean Intellectual Property Office, the entirety of which is hereby incorporated by reference herein.

BACKGROUND

1. Field

One or more embodiments relate to a method of manufacturing an electronic device, and more particularly, to a method of manufacturing an electronic device, the method being capable of reducing damage and deformation of an electronic device which occur in the process of peeling off the electronic device, and manufacturing a large-area electronic device having a complex shape.

2. Description of Related Art

In general, when manufacturing an electronic device, an electronic device may be directly formed on a transfer target to be a component of the electronic device. However, if necessary, the electronic device may be formed on a transfer substrate and then peeled off from the transfer substrate and transferred to the transfer target.

However, when the electronic device is peeled off from the transfer substrate, the arrangement of the electronic device may be different from an initial arrangement due to the flow of a solution used for the detachment, or the electronic device may be damaged by a laser.

SUMMARY

One or more embodiments are to solve the problem described above and include an electronic device manufacturing method for reducing damage and deformation of an electronic device, which occur in the process of peeling off the electronic device, and manufacturing a large area electronic device having a complex shape. However, the technical goal is only an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a method of manufacturing an electronic device includes forming a stack structure by placing a to-be-peeled layer on a substrate, applying thermal shock to the stack structure, detaching the to-be-peeled layer from the substrate, and transferring the detached to-be-peeled layer to a target substrate.

The applying of the thermal shock may include generating thermal stresses in opposite directions in the substrate and the to-be-peeled layer.

The applying of the thermal shock may include cooling the stack structure after heating the stack structure.

The applying of the thermal shock may include heating the substrate until a temperature of the substrate reaches from 100° C. to 400° C.

The applying of the thermal shock may include cooling the substrate until a temperature of the substrate reaches room temperature.

The to-be-peeled layer may include a thin film and a functional layer, wherein the forming of the stack structure may include placing the thin film on the substrate, and placing the functional layer on the thin film.

The substrate and the thin film may have different thermal expansion coefficients, wherein the applying of the thermal shock may include generating shear stress at an interface between the substrate and the thin film to peel off the thin film from the substrate.

The thin film may include metal having a thermal expansion coefficient higher than a thermal expansion coefficient of the substrate.

The functional layer may include a protective layer in contact with the thin film, and an electronic element arranged on the protective layer.

The detaching of the to-be-peeled layer may include bonding a transfer layer onto the to-be-peeled layer, and detaching the to-be-peeled layer and the transfer layer bonded to each other from the substrate.

The transfer layer may include any one of polydimethyl siloxane (PDMS), heat-peeling tape, or water-soluble tape.

Other aspects, features, and advantages other than those described above will become apparent from the following detailed description, claims, and drawings.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 12A is a X-ray photoelectron spectroscopy (XPS) analysis graph of an electronic device manufactured using a method of manufacturing an electronic device, according to an embodiment;

FIG. 12B is a X-ray photoelectron spectroscopy (XPS) analysis graph of an electronic device manufactured using a method of manufacturing an electronic device, according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. The terms are only used to distinguish one component from another.

Terms used herein are for the purpose of describing particular example embodiments and are not intended to limit the present disclosure. It will be further understood that the terms "comprise", "include", and "have" used herein are intended to indicate that there is a feature, a number, a step, an operation, a component, a part, or a combination thereof described in the specification, and the presence or addition of one or more other features, numbers, steps, operations, components, parts or combinations thereof is not precluded.

Hereinafter, one or more embodiments of the present disclosure will be described below in more detail with reference to the accompanying drawings.

FIGS. 1 to 10 are diagrams illustrating a method of manufacturing an electronic device (hereinafter, referred to as "electronic device manufacturing method"), according to an embodiment.

Referring to FIGS. 1 to 10, the electronic device manufacturing method includes forming a stack structure 10 by placing a layer 200 to be peeled off (hereinafter, referred to as a "to-be-peeled layer") on a substrate 100, applying thermal shock to the stack structure 10, detaching the to-be-peeled layer 200 from the substrate 100, and transferring the detached to-be-peeled layer 200 to a transfer target 400.

Figure 1:
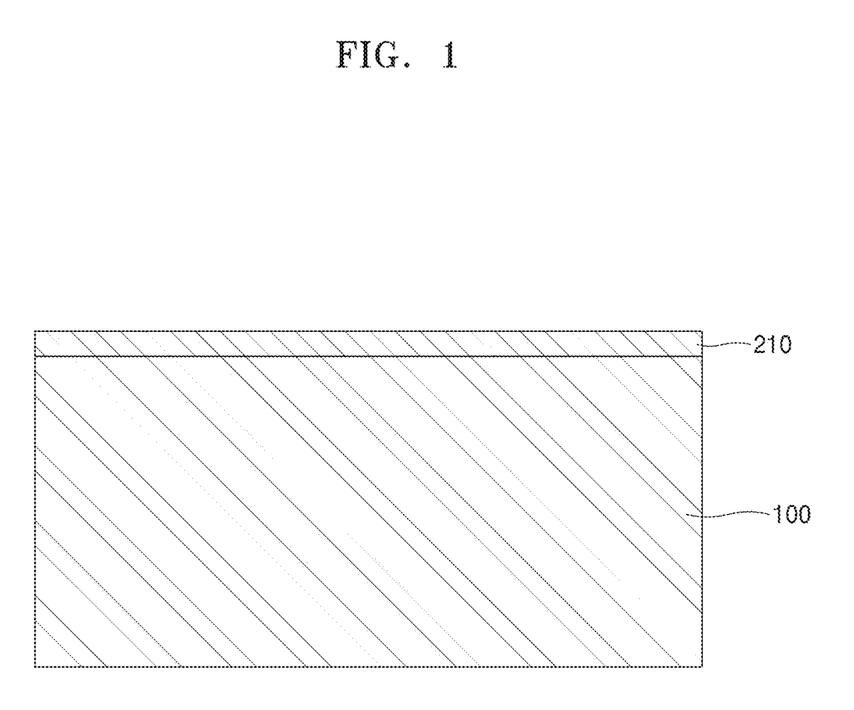
FIG. 1 is a diagram illustrating a method of manufacturing an electronic device, according to an embodiment.

First, the substrate 100 is prepared. The material of the substrate 100 is not particularly limited, and a generally used silicon substrate may be used as the substrate 100. The substrate 100 may include an opaque material. That is, in the electronic device manufacturing method according to an embodiment, a general-purpose substrate may be used as it is, and thus its utilization is high. In an embodiment, the substrate 100 may include a silicon substrate or a glass substrate.

Next, as shown in FIG. 1, a thin film 210 is placed on the substrate 100. The thin film 210 is in direct contact with the substrate 100 and is interposed between the substrate 100 and a functional layer 220. Although the thickness of the thin film 210 is not particularly limited, as described later, the thickness of the thin film 210 may be several nm to several hundred nm in order for the thin film 210 to be easily peeled off according to a difference in the coefficient of thermal expansion between the substrate 100 and the thin film 210 when a thermal shock is applied to the stack structure 10. In addition, the thickness of the thin film 210 may be relatively small so as to implement a flexible electronic device 1. The thin film 210 may have a high thermal expansion coefficient and may include metal. For example, the thin film 210 may include any one of gold (Au), silver (Ag), and copper (Cu).

A method of placing the thin film 210 on the substrate 100 is not particularly limited, and a conventional deposition method may be applied. For example, a physical vapor deposition (PVD) method such as sputtering deposition or E-beam evaporation may be applied.

Figure 2:
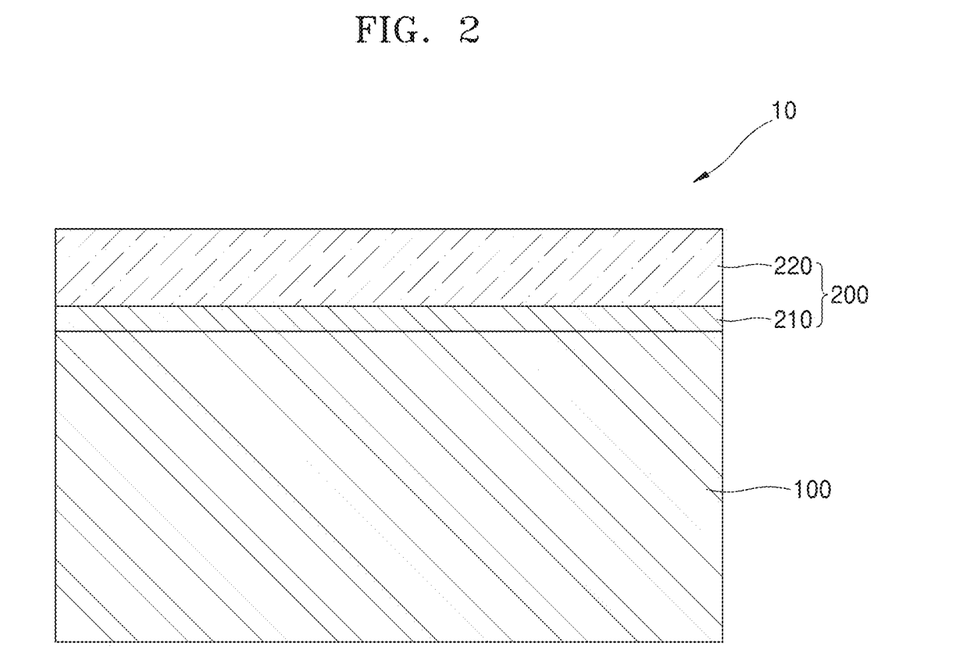
FIG. 2 is a diagram illustrating a method of manufacturing an electronic device, according to an embodiment.

Next, as shown in FIG. 2, the functional layer 220 is placed on the thin film 210. The functional layer 220 may be an electronic element coated with a protective layer. The protective layer may be an insulator that protects the electronic element from a physical shock and a sudden temperature change. For example, the protective layer may include a polymer such as polyimide.

The functional layer 220 may be placed on the thin film 210 in the following manner. First, a polymer is coated as a protective layer on the thin film 210 placed on the substrate 100. Next, a metal is deposited on the polymer and patterned. Then, a polymer is again coated to cover a metal part. However, it is not necessary to cover the metal part, and a next process may be performed in an exposed state.

The thin film 210 and the functional layer 220, which are stacked on the substrate 100, form the to-be-peeled layer 200. The to-be-peeled layer 200 is peeled off from the substrate 100 by a peeling process and finally placed on the transfer target 400. In addition, the substrate 100 and the to-be-peeled layer 200 form the stack structure 10.

According to the electronic device manufacturing method according to an embodiment, an electronic device of nanometers to meters may be manufactured without distortion and deformation of a shape. Therefore, the sizes and shapes of the thin film 210 and the functional layer 220 are not particularly limited, and the thin film 210 and the functional layer 220 having various shapes and patterns may be used. In addition, the thin film 210 and the functional layer 220 may have shapes corresponding to each other, or the thin film 210 may have a larger area than the functional layer 220.

In an embodiment, the substrate 100 and the thin film 210 may have different thermal expansion coefficients. For example, the thermal expansion coefficient of the thin film 210 may be greater than the thermal expansion coefficient of the substrate 100 so that, by a thermal shock, tensile stress acts on the substrate 100 and compressive stress acts on the thin film 210.

Next, a thermal shock is applied to the stack structure 10. The thermal shock causes a sudden temperature change in an object and causes a physical change in the object. In an embodiment, the thermal shock may be given by heating the stack structure 10 and then immediately cooling the stack structure 10.

Figure 3:
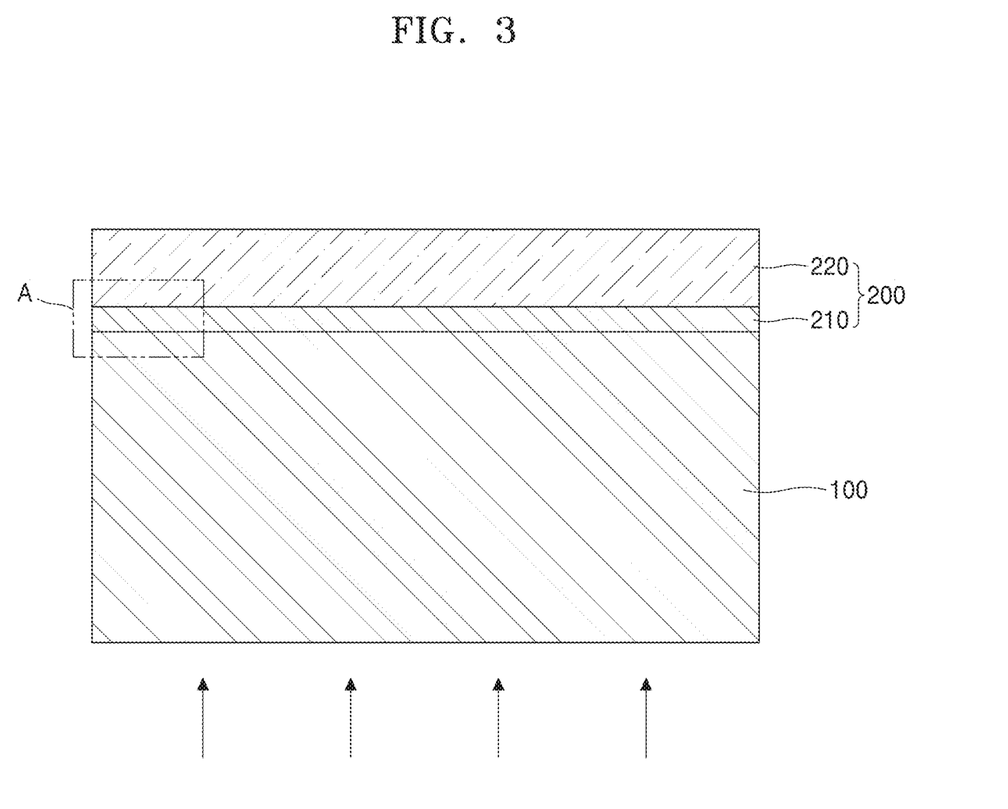
FIG. 3 is a diagram illustrating a method of manufacturing an electronic device, according to an embodiment.

First, as shown in FIG. 3, the stack structure 10 is heated. The arrows shown in FIG. 3 show a state in which heat is supplied to the stack structure 10 from the outside. A method of heating the stack structure 10 is not specifically limited. The stack structure 10 may be placed in a heating chamber or an oven, and then the stack structure 10 may be heated as a whole, the interface between the substrate 100 and the thin film 210 may be selectively heated, or a lower portion of the substrate 100 may be selectively heated using a hot plate or the like. In an embodiment, a hot plate may be arranged below the substrate 100 as a heating portion to heat the stack structure 10. When the stack structure 10 is heated, thermal stress is generated in the substrate 100 and the thin film 210.

Figure 4:
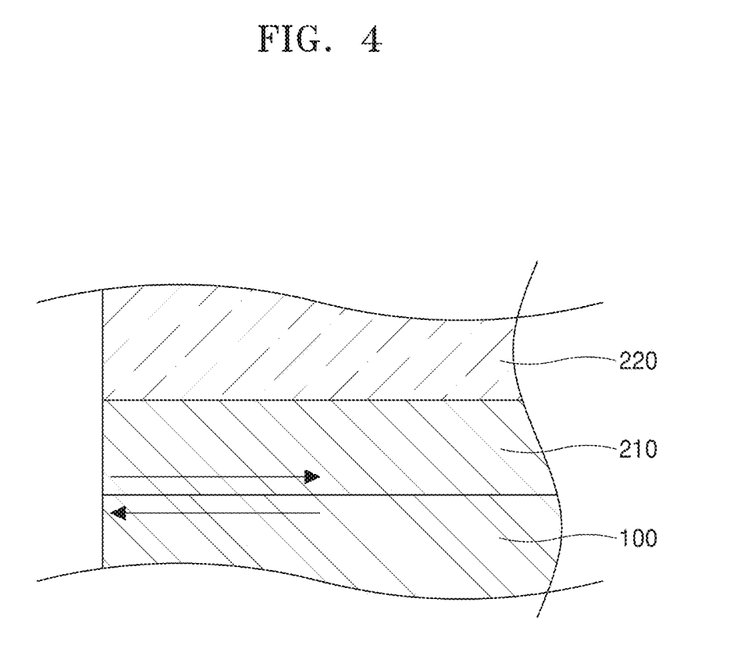
FIG. 4 is a diagram illustrating a method of manufacturing an electronic device, according to an embodiment.

Specifically, as shown in FIG. 4, which is an enlarged view of an area A of FIG. 3A, when the stack structure 10 is heated, as the temperature of the substrate 100 increases, the substrate 100 expands to thereby generate tensile stress therein. On the other hand, since the thermal expansion coefficient of the thin film 210 is greater than the thermal expansion coefficient of the substrate 100 as described above, the thin film 210 has an expansion ratio greater than that of the substrate 100. However, since the thin film 210 is in a state where the shape thereof is fixed by the substrate 100, the expansion of the thin film 210 is restricted, and thus compressive stress is generated inside the thin film 210. Therefore, as indicated by the arrow in FIG. 4, thermal stresses in opposite directions occur in an upper portion of the substrate 100 and a lower portion of the thin film 210. Accordingly, shear stress is generated at the interface between the substrate 100 and the thin film 210 in a direction parallel to the interface, thereby weakening a bonding force between the substrate 100 and the thin film 210.

The heating process may be performed until the temperature of the substrate 100 reaches from 100° C. to 400° C. When the temperature of the substrate 100 is less than 100° C., thermal stress is not sufficiently generated in the substrate 100 and the thin film 210, and thus the thin film 210 may not be peeled off from the substrate 100. On the contrary, when the temperature of the substrate 100 exceeds 400° C., the functional layer 220 may be damaged.

The time required for the heating process depends on the materials and sizes of the substrate 100 and the thin film 210, the characteristics of the heating portion, and the like, and is not particularly limited. For example, it may take about 10 minutes to heat the substrate 100 to 400° C. by using a hot plate as the heating portion.

Figure 5:
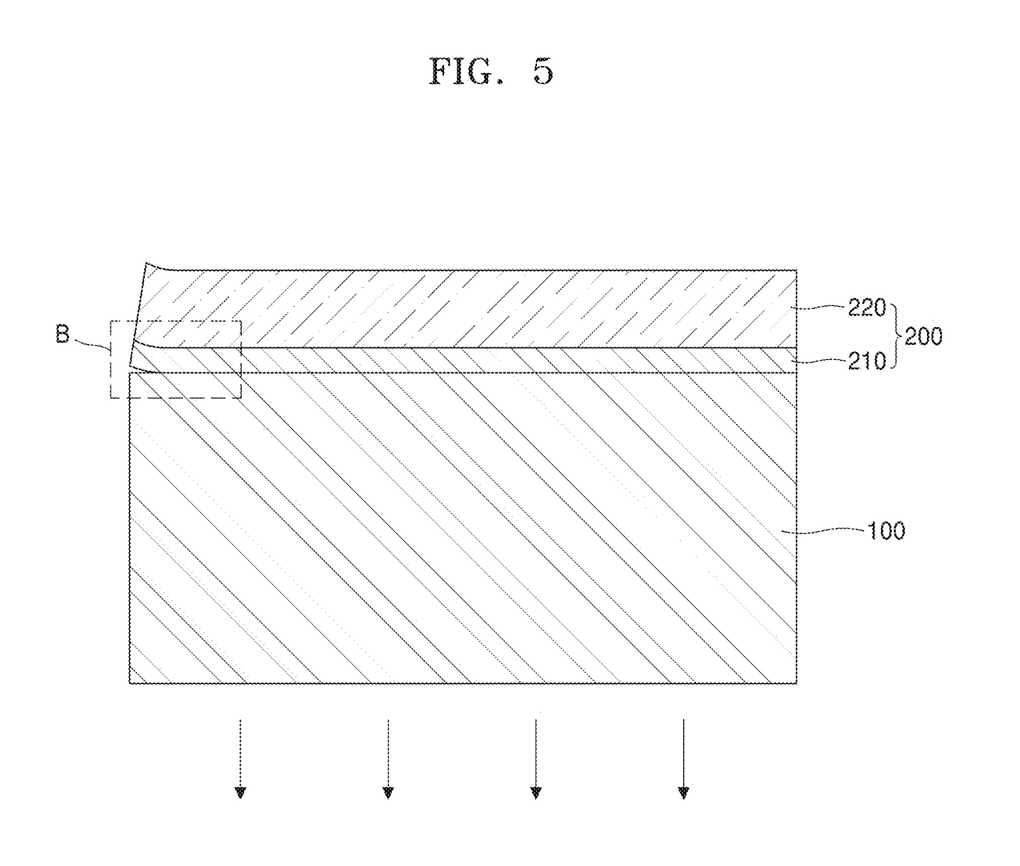
FIG. 5 is a diagram illustrating a method of manufacturing an electronic device, according to an embodiment.

Next, as shown in FIG. 5, the stack structure 10 is cooled. The arrow shown in FIG. 5 shows a state in which heat is released from the stack structure 10 to the outside. A cooling process may be carried out immediately after the heating operation is completed, in order to apply a thermal shock to the stack structure 10. As in the heating process, the stack structure 10 may be cooled as a whole, the interface between the substrate 100 and the thin film 210 may be selectively cooled, or a lower portion of the substrate 100 may be selectively cooled by using a cooling portion. In an embodiment, the cooling portion may be attached to the lower portion of the substrate 100. When the stack structure 10 is cooled, thermal stress is generated in the substrate 100 and the thin film 210.

Figure 6:
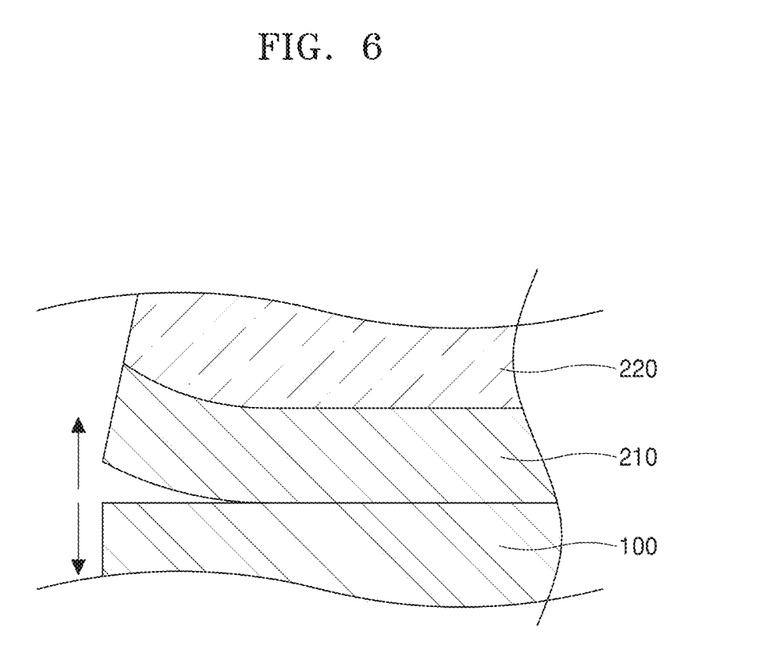
FIG. 6 is a diagram illustrating a method of manufacturing an electronic device, according to an embodiment.

Specifically, as shown in FIG. 6, which is an enlarged view of an area B of FIG. 5, when the stack structure 10 is cooled, the substrate 100 contracts as the temperature thereof drops, and compressive stress is generated in the substrate 100. On the other hand, since the thermal expansion coefficient of the thin film 210 is greater than the thermal expansion coefficient of the substrate 100 as described above, the thin film 210 has a shrinkage ratio greater than that of the substrate 100. However, since the thin film 210 is in a state where the shape thereof is fixed by the substrate 100, the shrinkage of the thin film 210 is restricted, and thus tensile stress is generated inside the thin film 210. That is, in the cooling process, thermal stress is generated in the stack structure 10 in a direction opposite to that of the thermal stress generated in the heating process. Accordingly, in a state in which a bonding force between the substrate 100 and the thin film 210 is weakened during the heating process, shear stress is generated at the interface between the substrate 100 and the thin film 210 while the thermal stress acts in the opposite direction. As a result, fine peeling occurs from the lengthwise end of the thin film 210, and the thin film 210 is peeled off from the substrate 100. That is, the to-be-peeled layer 200 is peeled off from the substrate 100.

The cooling portion is not particularly limited. However, in order to quickly cool the heated stack structure 10 and apply thermal shock thereto, a cooling plate including a material having high thermal conductivity may be attached to a lower portion of the substrate 100 to perform cooling. Specifically, an aluminum plate may be used as the cooling plate.

A cooling temperature in the cooling process is not particularly limited, and the substrate 100 may be cooled until the temperature of the substrate 100 reaches room temperature. Alternatively, the substrate 100 and the thin film 210 may be cooled to room temperature or lower in order to reliably peel off the thin film 210 from the substrate 100.

The time required for the cooling process depends on the materials and sizes of the substrate 100 and the thin film 210 and the characteristics of the cooling portion, and is not particularly limited. However, the time required for the cooling process may be relatively short in order to apply thermal shock to the stack structure 10, and the thin film 210 may be easily peeled off from the substrate 100 by cooling the substrate 100 to room temperature within 1 minute.

In addition, after the heating process and the cooling process, the thin film 210 does not necessarily have to be physically completely peeled off from the substrate 100. That is, in the process of detaching the to-be-peeled layer 200 from the substrate 100 by using the transfer layer 300 as described below, it is sufficient that an adhesive force between the substrate 100 and the thin film 210 is weakened to prevent damage to the substrate 100 and the to-be-peeled layer 200.

Next, the to-be-peeled layer 200 peeled off from the substrate 100 is detached from the substrate 100. A method of detaching the to-be-peeled layer 200 from the substrate 100 is not particularly limited, but in an embodiment, the transfer layer 300 is bonded onto the to-be-peeled layer 200, and then the to-be-peeled layer 200 and the transfer layer 300, which are bonded to each other, may be detached from the substrate 100.

Figure 7:
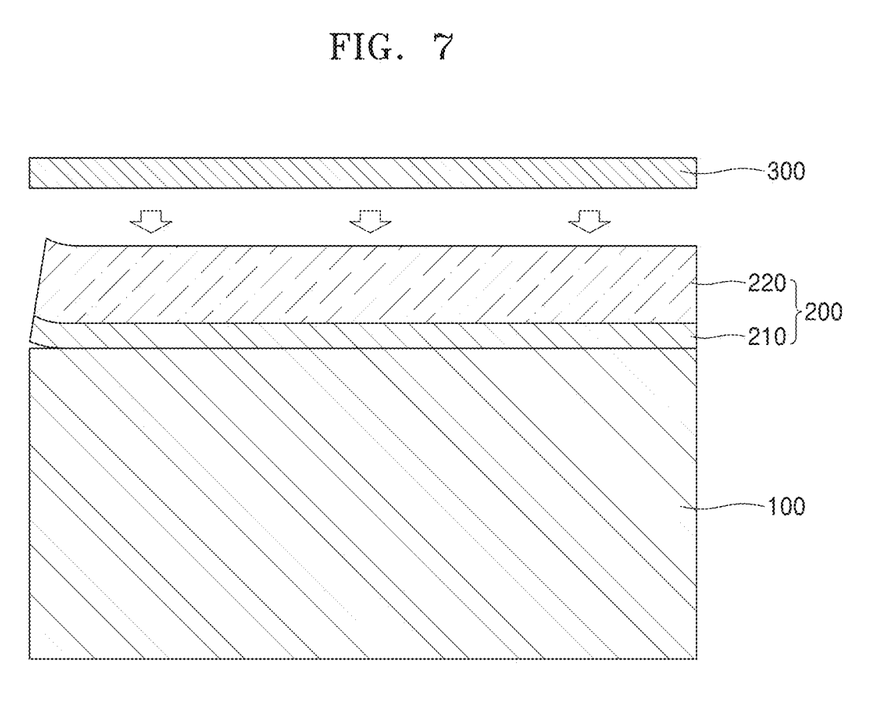
FIG. 7 is a diagram illustrating a method of manufacturing an electronic device, according to an embodiment.

First, as shown in FIG. 7, the transfer layer 300 is bonded to the upper surface of the to-be-peeled layer 200. The transfer layer 300 may be a member that is easily bonded to the functional layer 220 and is suitable for transferring the functional layer 220 to the transfer target 400. The area of the transfer layer 300 may be appropriately selected in consideration of the area of the to-be-peeled layer 200 and may be greater than that of the to-be-peeled layer 200 in order to easily perform a transfer process. The transfer layer 300 may include any one of polydimethyl siloxane (PDMS), heat-peeling tape, or water-soluble tape.

Figure 8:
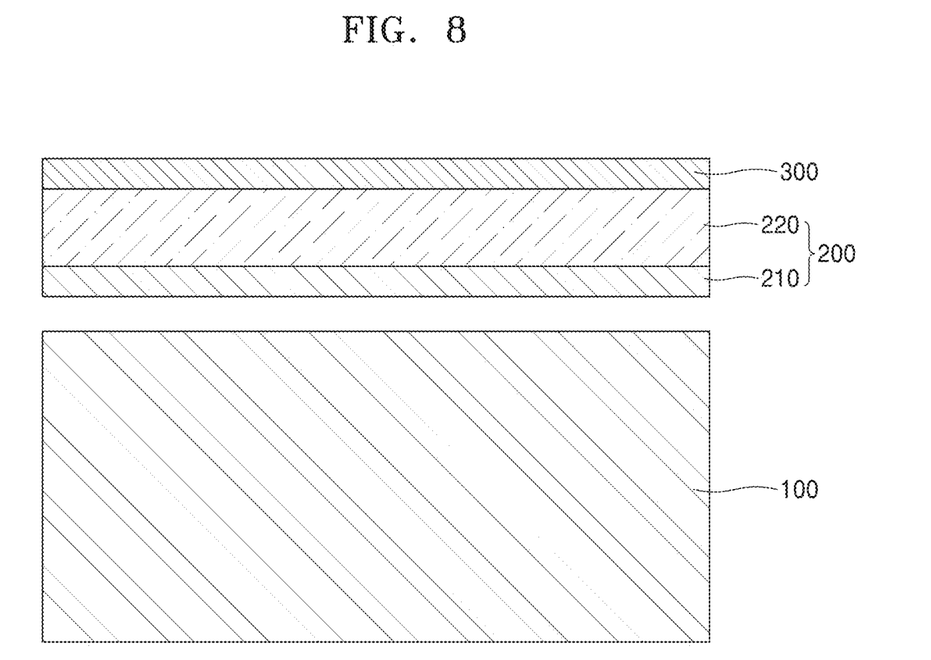
FIG. 8 is a diagram illustrating a method of manufacturing an electronic device, according to an embodiment.

Next, as shown in FIG. 8, the transfer layer 300 bonded to the to-be-peeled layer 200 is lifted up to detach the to-be-peeled layer 200 from the substrate 100. As described above, after the operation of applying thermal shock to the stack structure 10 is completed, the to-be-peeled layer 200 may be completely peeled from the substrate 100 or the to-be-peeled layer 200 and the substrate 100 may be adhered to each other while maintaining a very weak adhesive force. In this case, a predetermined force necessary for peeling may be applied to completely detach the to-be-peeled layer 200 from the substrate 100. In any case, after the to-bepeeled layer 200 is detached from the substrate 100 after the thermal shock is applied, the thin film 210 does not remain on the upper surface of the substrate 100.

Figure 9:
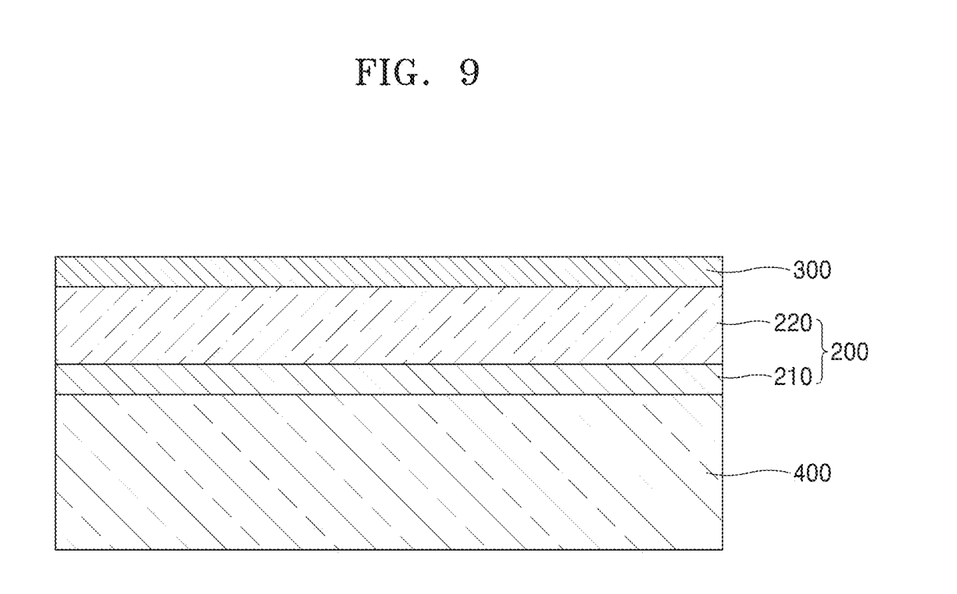
FIG. 9 is a diagram illustrating a method of manufacturing an electronic device, according to an embodiment.

Next, as shown in FIG. 9, the detached to-be-peeled layer 200 is transferred to the transfer target 400. Specifically, the transfer layer 300 is arranged such that the lower surface of the to-be-peeled layer 200 (the thin film 210) bonded to the transfer layer 300 contacts the upper surface of the transfer target 400. The lower surface of the to-be-peeled layer 200 may be adhered to the upper surface of the transfer target 400, and then the transfer layer 300 may be removed.

A method for removing the transfer layer 300 is not particularly limited. For example, when the transfer layer 300 includes PDMS, the upper surface of the transfer target 400 may include a member (e.g., polyimide, etc.) having greater adhesion than PDMS. In this case, the to-be-peeled layer 200 may be bonded to the transfer target 400, and then the transfer layer 300 may be removed from the to-be-peeled layer 200. In addition, when the transfer layer 300 includes a heat-peeling tape, the transfer layer 300 placed on the upper surface of the transfer target 400 may be heated to a predetermined temperature to peel off the transfer layer 300 from the to-be-peeled layer 200. In addition, when the transfer layer 300 includes a water-soluble tape, the transfer layer 300 may be removed by bringing water into contact with the transfer layer 300. As described above, in the electronic device manufacturing method according to the embodiment, various transfer methods may be used.

Figure 10:
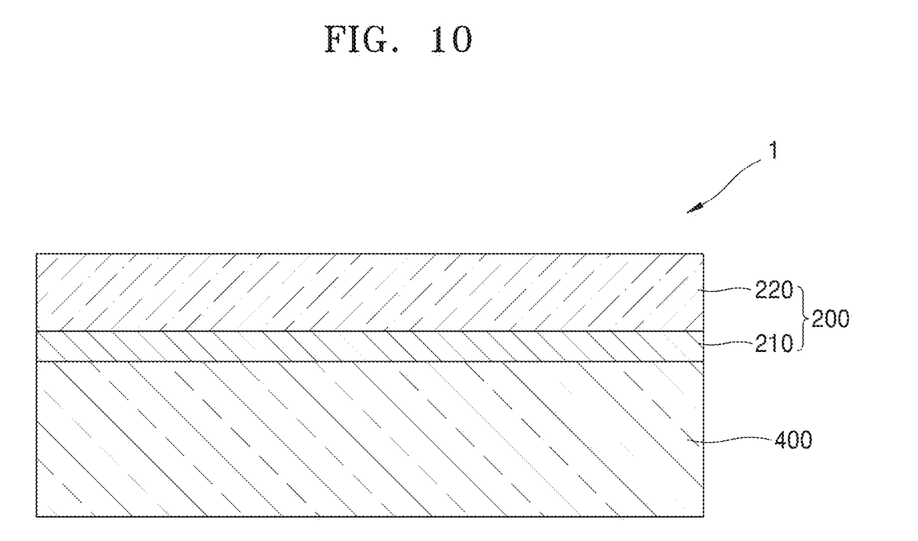
FIG. 10 is a diagram illustrating a method of manufacturing an electronic device, according to an embodiment.

After the transfer layer 300 is removed, only the to-be-peeled layer 200 remains on the upper surface of the transfer target 400. Then, the electronic device 1 is finally completed by attaching a commercial chip or light-emitting diode (LED) to the upper surface of the to-be-peeled layer 200.

Figure 11:
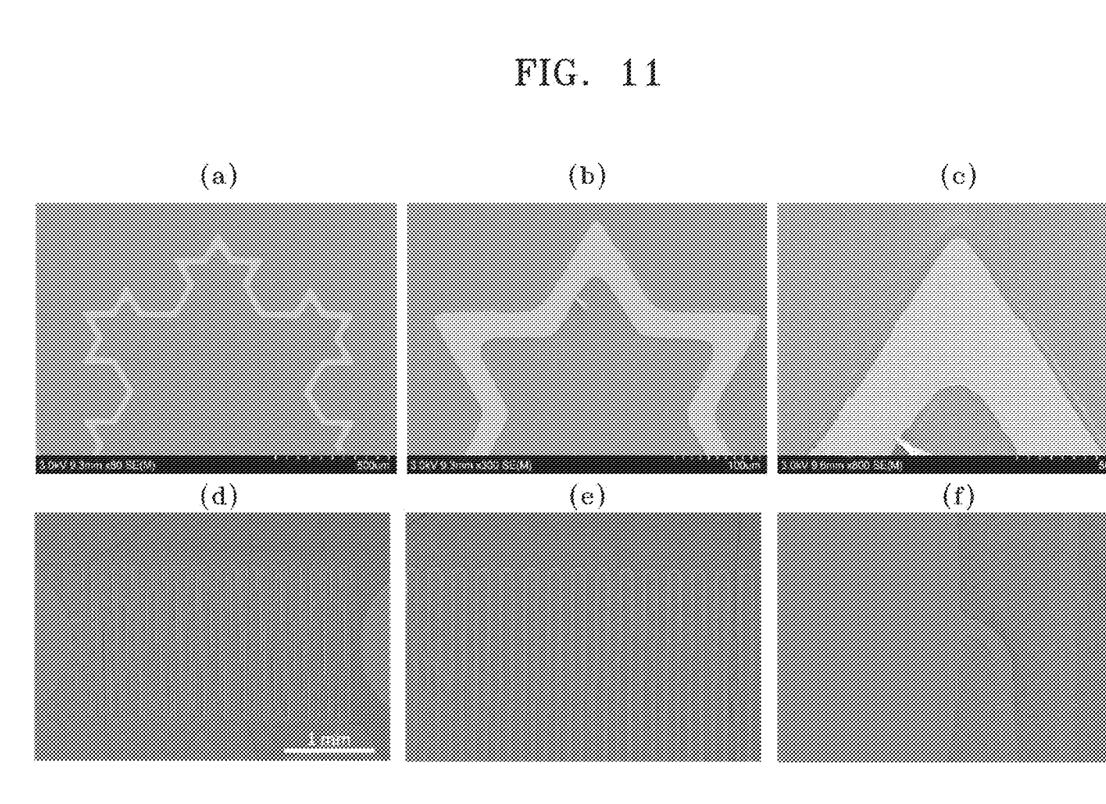
FIG. 11 is a diagram illustrating a partial configuration of an electronic device manufactured by a method of manufacturing an electronic device, according to an embodiment.

FIG. 11 is a diagram illustrating a partial configuration of the electronic device 1 manufactured by the electronic device manufacturing method according to the embodiment. More specifically, FIGS. 11A to 11F illustrate the upper surface of the to-be-peeled layer 200 peeled off from the substrate 100.

Referring to FIGS. 11A to 11F, in the electronic device 1 manufactured by the electronic device manufacturing method according to the embodiment, even when the thin film 210 and the functional layer 220 each have the shape of a complicated pattern having a very narrow width, the distortion and deformation of the shape hardly occur.

FIGS. 12A and 12B are X-ray photoelectron spectroscopy (XPS) analysis graphs of the electronic device 1 manufactured using the electronic device manufacturing method according to an embodiment.

FIG. 12A is a graph showing the result of XPS analysis on the lower surface of the thin film 210 after peeling, and FIG. 12B is a graph showing the result of XPS analysis on the upper surface of the substrate 100 after peeling. In this case, the material of the substrate 100 and the material of the thin film 210 include Si and Cu, respectively. As shown in FIGS. 12A and 12B, almost no Si is present in the lower surface of the thin film 210 after peeling, and almost no Cu is present in the upper surface of the substrate 100 after peeling. That is, according to the electronic device manufacturing method according to the embodiment, the components of the substrate 100 and the thin film 210 are peeled off without remaining on the opposite side. Accordingly, the lower surface of the thin film 210 may be flat and uniform after peeling, and thus the thin film 210 and the transfer target 400 may be bonded more reliably to each other. In addition, since the component of the substrate 100 is not mixed with the thin film 210, the electronic device 1 having desired physical properties may be finally obtained.

Figure 13:
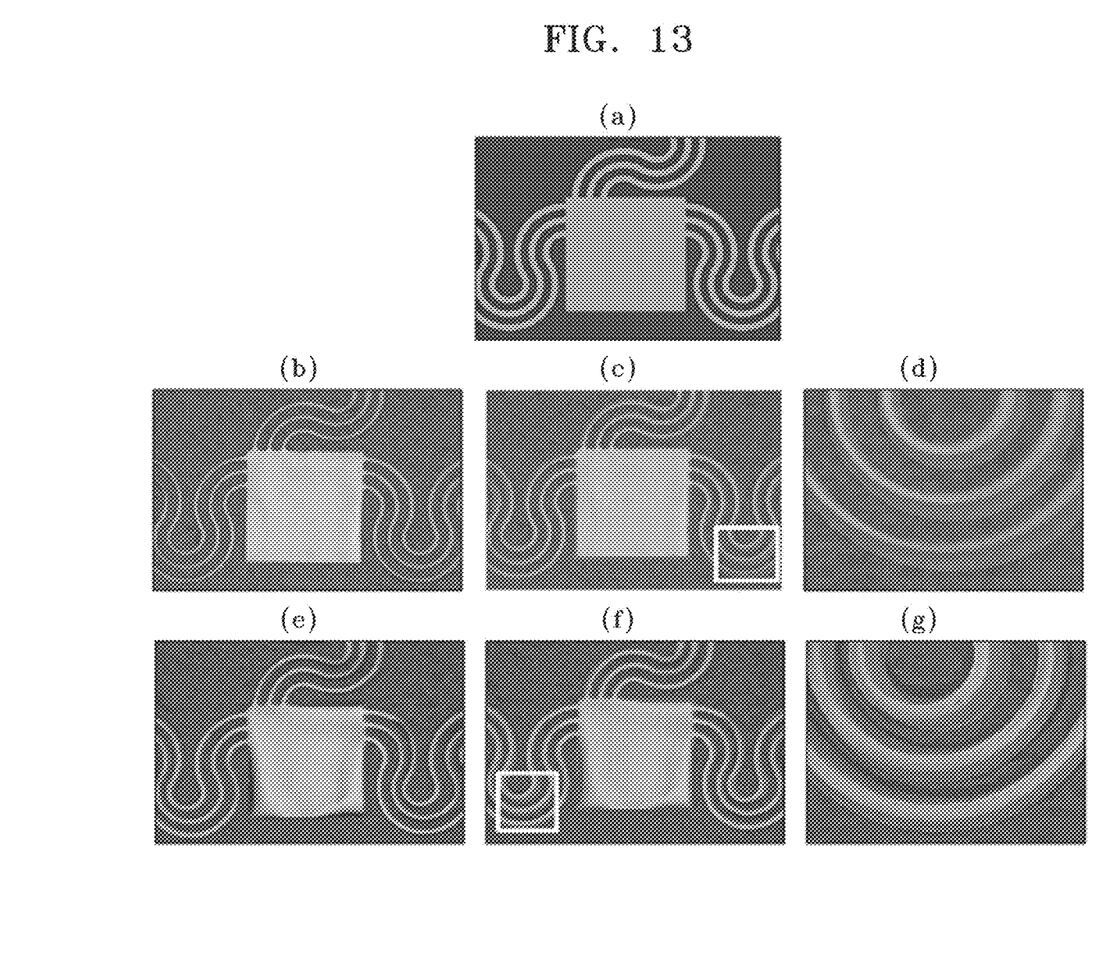
FIG. 13 is a diagram for comparing a method of manufacturing an electronic device according to an embodiment with a conventional method of manufacturing an electronic device.

FIG. 13 is a diagram for comparing the electronic device manufacturing method according to the embodiment and a conventional electronic device manufacturing method.

FIG. 13A is a diagram illustrating an original design drawing of an electronic element, FIGS. 13B to 13D show a to-be-peeled layer 200 peeled off according to the electronic device manufacturing method according to the embodiment, and FIGS. 13E to 13G show an electronic element peeled off by a wet peeling method of a conventional electronic device manufacturing method.

Even when the electronic element has a complicated pattern as shown in FIG. 13A, in the to-be-peeled layer 200 obtained by using the electronic device manufacturing method according to the embodiment, as shown in FIGS. 13B to 13D, wrinkles are not formed in the surface thereof and there is almost no deviation in shape as compared with the original design drawing.

On the other hand, in the case of the electronic element obtained by the wet peeling method of the conventional electronic device manufacturing method, as shown in FIGS. 13E to FIG. 13G, wrinkles form in the electronic element and the deviation of the shape is relatively large.

This is because, since a separate solution is used to remove a sacrificial layer in the case of the wet peeling method, the placement of the electronic element is changed from an initial design due to a meniscus phenomenon, in which a solution forms a curved surface along the interface of the electronic element, or the movement of the solution, and thus the shape of the electronic element is distorted.

On the other hand, in the case of the electronic device manufacturing method according to the embodiment, since a solution is not used, the problem that the placement of the to-be-peeled layer 200 is deformed or distorted by the solution as shown in FIG. 13 does not occur.

In addition, in the case of the wet peeling method, since a solution is diffused into a sacrificial layer interposed between a substrate and an electronic element and needs to chemically react with the sacrificial layer, it takes a long time to melt the sacrificial layer for a large area substrate. The time required for the peeling process may vary depending on the materials or sizes of the substrate and the sacrificial layer, but for a large area substrate, it usually takes several hours to complete the peeling process. There is also the problem of hazards due to the use of chemical solutions.

In addition, in the case of a laser lift-off method using a laser in the conventional electronic device manufacturing method, the substrate has to include a light-transmitting material that may transmit the laser and it is expensive to construct laser equipment. In addition, since the interface between the substrate and a to-be-peeled layer is heated to a very high temperature, deformation due to high heat is inevitable. In addition, because the laser has to be concentrated in a certain area, it is not suitable for manufacturing a large-area electronic element.

On the other hand, in the electronic device manufacturing method according to the embodiment, only a time required for cooling the substrate 100 after heating the substrate 100 to a predetermined temperature is required. Thus, a to-be-peeled layer 200 having a large area may also be peeled off quickly, and thus there is no restriction on the sizes of the thin film 210 and the functional layer 220, and the time required for the electronic device manufacturing process may be shortened. In addition, since the peeling process is performed within a temperature range where deformation caused by heat does not occur, deformation does not occur in the substrate 100 or the to-be-peeled layer 200.

In addition, in the electronic device manufacturing method according to the embodiment, the peeling process is performed in a state in which the thin film 210 and the functional layer 220 are formed on the substrate 100, and there is no need to additionally form a separate layer (e.g., hydrogen ion implantation layer). Thus, the process of manufacturing the electronic device 1 is very simple and the time and cost required for the process may be drastically reduced. In addition, a thin film 210 having an extremely small thickness of several nm may be used to implement a very flexible electronic device 1.

The electronic device manufacturing method according to the embodiment may reduce damage to an electronic element and distortion and deformation of the electronic element, which are generated in the process of peeling off the electronic element.

In addition, the time required for peeling off the electronic element may be drastically reduced, and thus a large area electronic element having a complicated shape may be quickly manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing an electronic device, the method comprising:
    forming a stack structure by placing a to-be-peeled layer on a substrate, wherein the to-be-peeled layer comprises a thin film and a functional layer, and wherein the thin film is placed on the substrate and the functional layer is placed on the thin film;
    applying thermal shock to the stack structure;
    detaching the to-be-peeled layer from the substrate; and
    transferring the detached to-be-peeled layer to a target substrate; and
    wherein the thin film comprises metal having a thermal expansion coefficient higher than a thermal expansion coefficient of the substrate,
    wherein the thermal shock comprises heating the substrate until a temperature of the substrate reaches from 100° C. to 400° C., then immediately cooling the stack structure until the temperature of the substrate reaches room temperature within 1 minute, and
    wherein the applying of the thermal shock comprises generating shear stress at an interface between the substrate and the thin film to peel off the thin film from the substrate.

2. The method of claim 1, wherein the applying of the thermal shock comprises generating thermal stresses in opposite directions in the substrate and the to-be-peeled layer.

3. The method of claim 1, wherein the functional layer comprises:
    a protective layer in contact with the thin film; and
    an electronic element arranged on the protective layer.

4. The method of claim 1, wherein the detaching of the to-be-peeled layer comprises bonding a transfer layer onto the to-be-peeled layer, and detaching the to-be-peeled layer and the transfer layer bonded to each other from the substrate.

5. The method of claim 4, wherein the transfer layer comprises any one of polydimethyl siloxane (PDMS), heat-peeling tape, or water-soluble tape.

* * * * *